United States Patent
Kim et al.

[11] Patent Number: 6,159,826
[45] Date of Patent: Dec. 12, 2000

[54] SEMICONDUCTOR WAFER AND FABRICATION METHOD OF A SEMICONDUCTOR CHIP

[75] Inventors: Jae Woon Kim; Jong Hoon Park, both of Choongcheongbuk-Do, Rep. of Korea

[73] Assignee: Hyundai Electronics Industries Co., Ltd., Ichon-shi, Rep. of Korea

[21] Appl. No.: 09/154,579

[22] Filed: Sep. 17, 1998

[30]  Foreign Application Priority Data

Dec. 29, 1997 [KR] Rep. of Korea ................. 97-75855

[51] Int. Cl.$^7$ ................................................. H01L 23/48
[52] U.S. Cl. ........................ 438/460; 438/15; 438/462
[58] Field of Search ........................ 257/48, 786; 438/14, 438/15, 460, 462, 461, 463, 465, 612

[56]  References Cited

U.S. PATENT DOCUMENTS

| | | | |
|---|---|---|---|
| 5,239,191 | 8/1993 | Sakumoto et al. | 438/14 |
| 5,285,082 | 2/1994 | Axer | 257/786 |
| 5,622,899 | 4/1997 | Chao et al. | 438/462 |
| 5,668,062 | 9/1997 | Hyun et al. | 438/462 |
| 5,719,449 | 2/1998 | Strauss | 257/786 |
| 5,786,266 | 7/1998 | Boruta | 438/462 |
| 5,923,047 | 7/1999 | Chia et al. | 257/786 |
| 5,982,042 | 11/1999 | Nakamura | 257/48 |
| 6,022,797 | 2/2000 | Ogasawara et al. | 438/672 |

*Primary Examiner*—Donald L. Monin, Jr.
*Assistant Examiner*—Mike Dietrich
*Attorney, Agent, or Firm*—Fleshner & Kim, LLP

[57] ABSTRACT

The present invention relates to a semiconductor device, and more particularly to a structure of a semiconductor wafer and a fabrication method of semiconductor chips. According to the present invention, a semiconductor wafer containing a plurality of semiconductor chip portions has a plurality of chip scribe lanes formed between the semiconductor chip portions. A plurality of chip bonding pads are formed on the semiconductor chip portions of the wafer, and a plurality of wafer probing pads are formed on the chip scribe lanes. The wafer probing pads are electrically connected to internal circuits of the semiconductor chip portions and/or to corresponding ones of the chip bonding pads.

10 Claims, 5 Drawing Sheets

SEMICONDUCTOR WAFER AND FABRICATION METHOD OF A SEMICONDUCTOR CHIP

BACKGROUND OF THE INVENTION

1. Field of the Invention

The present invention relates to a structure of a semiconductor wafer and methods of making integrated semiconductor chips.

2. Background of the Related Art

FIG. 1 is a plan view of a semiconductor wafer. As shown therein, a plurality of semiconductor chips 12 are formed in the wafer 10 at regular intervals. The wafer 10 is divided into a plurality of semiconductor chips 12 by a cutting process.

FIG. 2 is an enlarged diagram of the circled area shown in FIG. 1. As shown in FIG. 2, chip scribe lanes 14 are formed between the areas of the wafer 10 that will become semiconductor chips 12. Each of the chip scribe lane 14 has a minimum width that must be maintained so that the semiconductor chip portions are not damaged when the wafer 10 is cut into a plurality of chips 12. Typically, each chip scribe lane 14 has a width of approximately 150 $\mu$m.

On each of the semiconductor chips 12, there are a plurality of bonding pads 16, which may be electrically connected to external pins or leads of a lead frame (not shown). Also, a plurality of wafer probing pads 18 are also formed on each chip 12. The bonding pads 16 and probing pads 18 typically have dimensions of approximately 100 $\mu$m×100 $\mu$m. The wafer probing pads 18 are for testing the semiconductor chip portions of a wafer before the wafer is cut into a plurality of semiconductor chips 12.

On a background art wafer 10, both the chip bonding pads 16 and the wafer probing pads 18 are formed on the areas of the wafer 10 corresponding to each of the semiconductor chips 12. The pads 16, 18 cannot be made smaller than a predetermined size. This makes it difficult to plan the layout of a highly integrated chip having many bond pads. The more bond pads one attempts to provide on the semiconductor chip, the harder it becomes to fit all the bond pads on the available area. This task is made even more difficult if the chip must also have a plurality of probing pads 18. Also, in a background art wafer 10, the wafer probing pads 18 are formed over internal circuits of the semiconductor chips 12. When a probing tip contacts a probing pad 18 to test a condition of a semiconductor chip, the internal circuits below the probing pad may be affected.

SUMMARY OF THE INVENTION

It is an object to of the present invention to provide a structure of a semiconductor wafer and a fabrication method of a semiconductor chip that obviates at least the problems of the prior art.

It is another object of the present invention to provide more layout area on a chip for bonding pads.

It is another object of the present invention to prevent an internal circuit formed in a semiconductor chip from being damaged during a probing tip test operation.

A semiconductor wafer embodying the invention includes a plurality of semiconductor chips portions provided at regular intervals on the wafer, wherein a plurality of chip bonding pads are formed on each semiconductor chip portion, and a plurality of chip scribe lanes are formed between the semiconductor chip portions. A plurality of wafer probing pads formed on the chip scribe lanes are electrically connected to circuits of the semiconductor chip portions, or corresponding ones of the chip bonding pads. Because the wafer probing pads are provided on the chip scribe lanes, there is more layout area on the chip portions for the bonding pads.

In preferred embodiments of the invention, the chip bonding pads are formed of conductive layers that are electrically connected to metal lines of internal circuits in the semiconductor chips by conductive regions in via holes. The wafer probing pads may be connected to circuits in the chips by conductive layers that extend horizontally into the scribe lanes.

A method of fabricating a semiconductor chip embodying the invention includes the steps of: forming a wafer, wherein a plurality of semiconductor chip portions having internal circuits are disposed at regular intervals on the wafer, and wherein a plurality of chip scribe lanes are formed between the semiconductor chip portions; forming a plurality of chip bonding pads on each of the semiconductor chip portions; forming a plurality of wafer probing pads on the scribe lanes, wherein the wafer probing pads are electrically connected to at least one of internal circuits of the semiconductor chip portion and corresponding ones of the chip bonding pads; and cutting the wafer along the chip scribe lanes to form a plurality of semiconductor chips.

In preferred embodiments of methods according to the present invention, the steps of forming chip bonding pads and wafer probing pads include the sub-steps of: forming a first insulating layer on the wafer; forming via holes in the first insulating layer to expose at least a portion of internal circuits of each of the semiconductor chip portions; forming conductive regions in the via holes; forming conductive layer patterns that are electrically connected to respective ones of the conductive regions in the via holes on the first insulating layer such that each of the conductive layer patterns extends over a portion of a semiconductor chip portion and a portion of a chip scribe lane; forming a second insulating layer on the first insulating layer and the conductive layer patterns; and exposing first portions of the conductive layer patterns on the semiconductor chip portions and second portions of the conductive layer patterns formed on the chip scribe lanes.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

Preferred embodiments of the invention will be described in conjunction with the following drawing figures, wherein like elements are labeled with like reference numbers, and wherein.

DETAILED DESCRIPTION OF PREFERRED EMBODIMENTS

Figure 1:
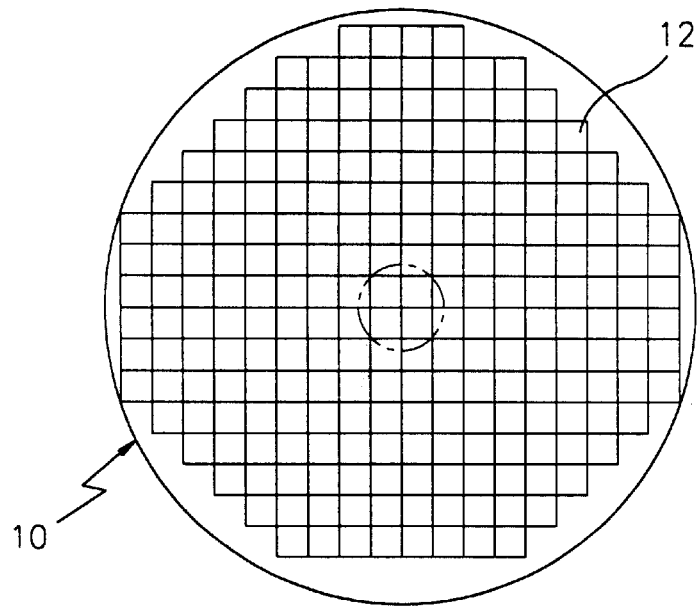
FIG. 1 is a plan view of a background art wafer.
Figure 2:
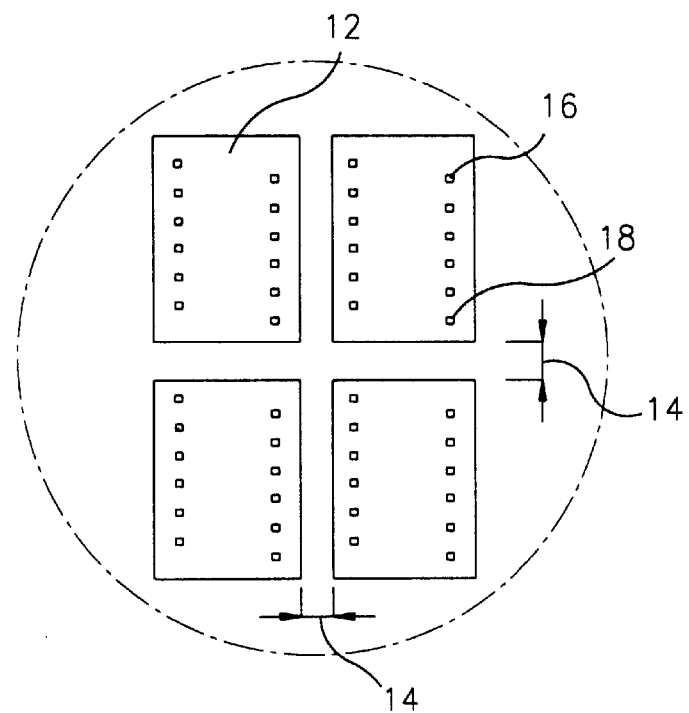
FIG. 2 is an enlarged diagram of a circled part in FIG. 1.
Figure 3:
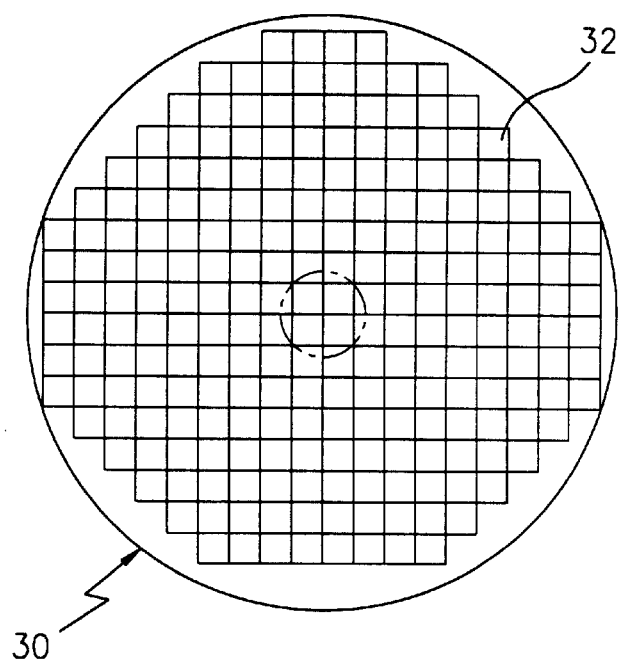
FIG. 3 is a plan view of a wafer according to the present invention.
Figure 4:
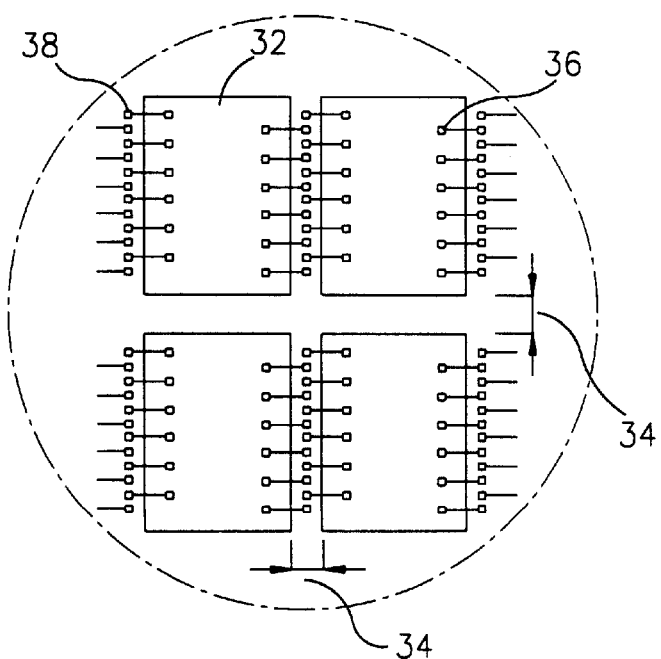
FIG. 4 is an enlarged diagram of a circled part in FIG. 3.

FIG. 3 is a plan view of a wafer according to the present invention. As shown therein, a plurality of substantially square semiconductor chip portions 32 are formed on a wafer 30 at regular intervals. FIG. 4 is an enlarged diagram of a circled part in FIG. 3. In FIG. 4, chip scribe lanes 34 are formed between the semiconductor chip portions 32. Each of the chip scribe lanes 34 have a minimum width so that the semiconductor chip portions 32 are not damaged when the wafer 30 is cut into individual chips.

On each of the semiconductor chip portions 32, there are a plurality of bonding pads 36. A plurality of wafer probing pads 38, formed on the chip scribe lanes 34, are electrically connected to corresponding ones of the bonding pads 36 or to circuits in the semiconductor chip portions 32. In a preferred embodiment, each of the chip scribe lanes 34 has a width of approximately 150 $\mu$m, and each of the bonding pads 36, and wafer probing pads 38 have dimensions of about 100 $\mu$m×100 $\mu$m. Thus, the wafer probing pads 38 can be formed within the chip scribe lanes 34 without any difficulty.

Figure 5:
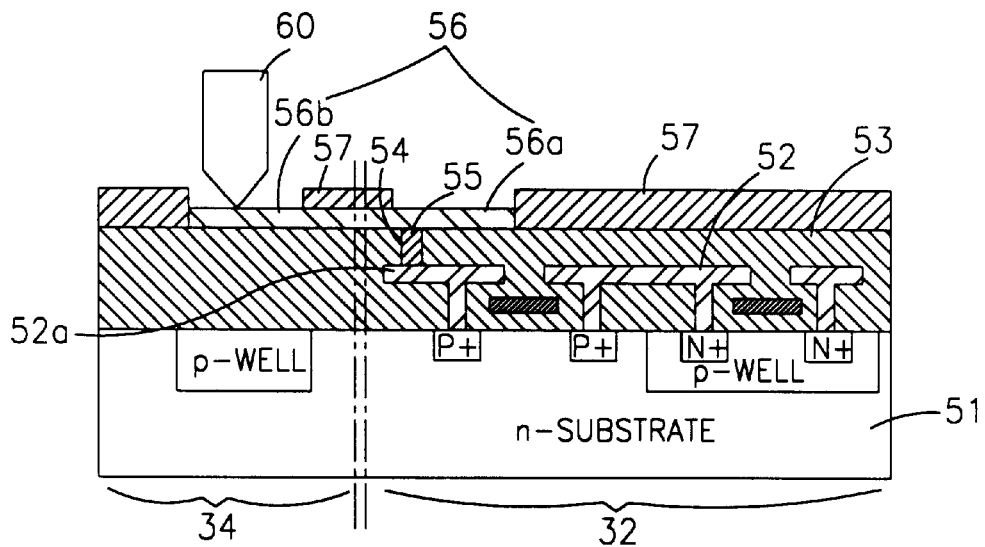
FIG. 5 is a vertical cross-sectional diagram of a semiconductor chip portion and an adjacent chip scribe lane of a wafer.

FIG. 5 is a vertical cross-sectional diagram of a portion of the wafer 30 shown in FIG. 4, including a semiconductor chip portion 32 and a chip scribe lane 34. As shown therein, an n-type substrate 51 is divided into two portions, a semiconductor chip portion 32 and a chip scribe lane portion 34. P– wells, P+ impurities, and N+ impurities are formed in the substrate 51. An internal circuit 52 is provided in the semiconductor chip portion 32, and a first insulating layer 53 is formed on the substrate 51 and over the internal circuit 52. A via hole 54 is formed in the first insulating layer 53 to expose a portion of a conductive line 52a of the internal circuit 52. A conductive region 55 fills the via hole 54. A conductive pattern 56 is formed on the first insulating layer 53 such that it electrically connects with the conductive region 55. Here, the conductive pattern 56 is divided into a first portion 56a formed on the semiconductor chip portion 32 and a second portion 56b formed on the chip scribe lane portion 34.

A second insulating layer 57 is formed on the first insulating layer 53 and on a boundary area of the first and second portions 56a, 56b of the conductive pattern between the semiconductor chip portion 32 and the chip scribe lane portion 34. Accordingly, the first portion 56a and the second portion 56b of the conductive pattern 56 are exposed out of the second insulating layer 57, and become the chip bonding pads 36 and the wafer probing pads 38, respectively.

Figure 6:
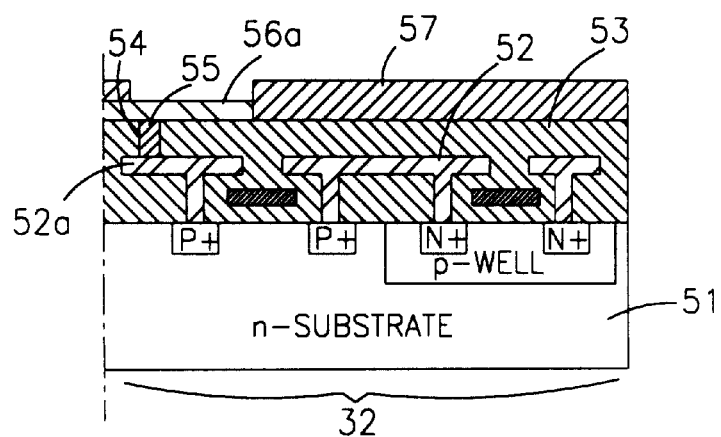
FIG. 6 is a vertical cross-sectional diagram of a semiconductor chip fabricated according to the present invention.

After the wafer structure shown in FIGS. 4 and 5 has been created, the internal circuit 52 of the semiconductor chip 32 is electrically tested by probing wafer probing tips 60 onto the wafer probing pads 56b. If the test indicates that the semiconductor chip 32 is properly formed, the wafer 30 is cut along the chip scribe lanes 34, thus fabricating a plurality of semiconductor chips 32, such as the one shown in FIG. 6.

Figure 7:
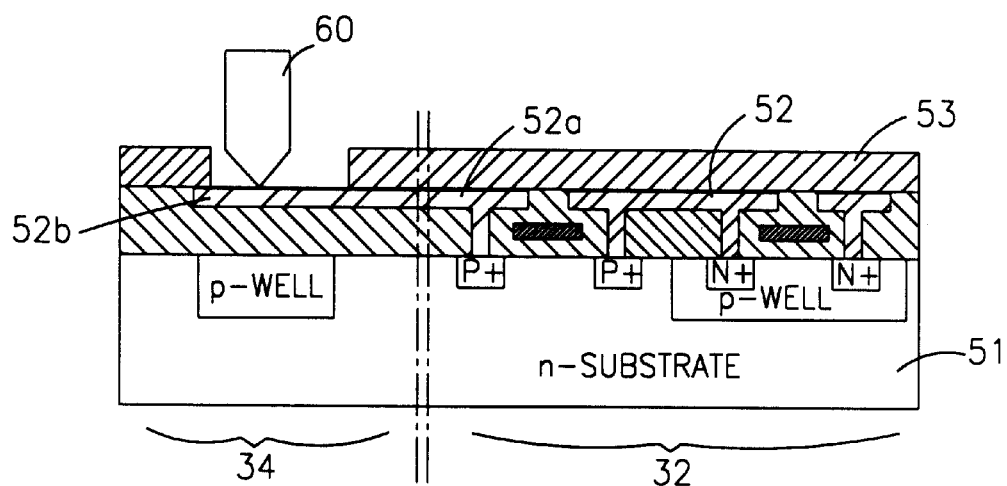
FIGS. 7 and 8 vertical are cross-sectional diagrams illustrating steps of a fabrication method according to the present invention.

FIG. 7 is a diagram of a wafer structure according to another embodiment of the present invention. In FIG. 7, an extended portion 52b of a conductive line 52a of an internal circuit 52 formed in a semiconductor chip portion 32 is extends to a chip scribe lane 34. A predetermined portion of an upper surface of the extended portion 52b is exposed out of a first insulating layer 53. Here, the exposed extended portion 52b forms a wafer probing pad 38, as shown in FIG. 4.

Figure 8:
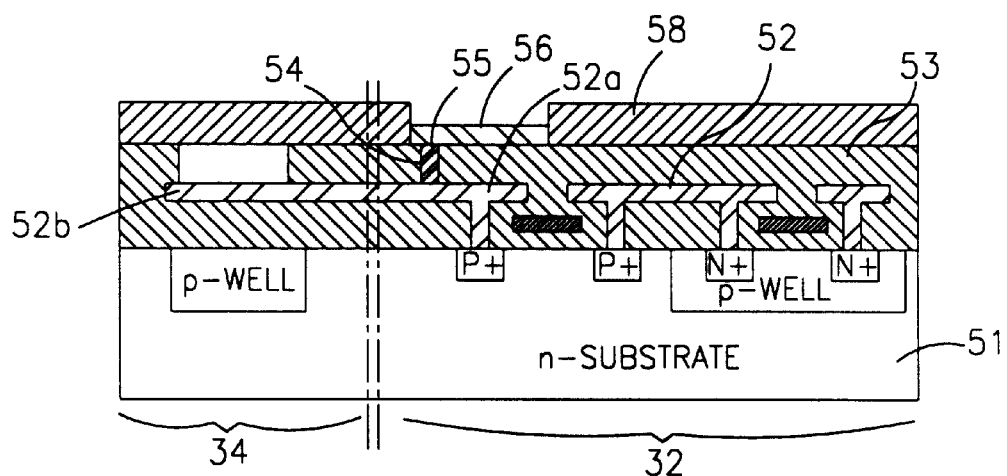
Figure 9:
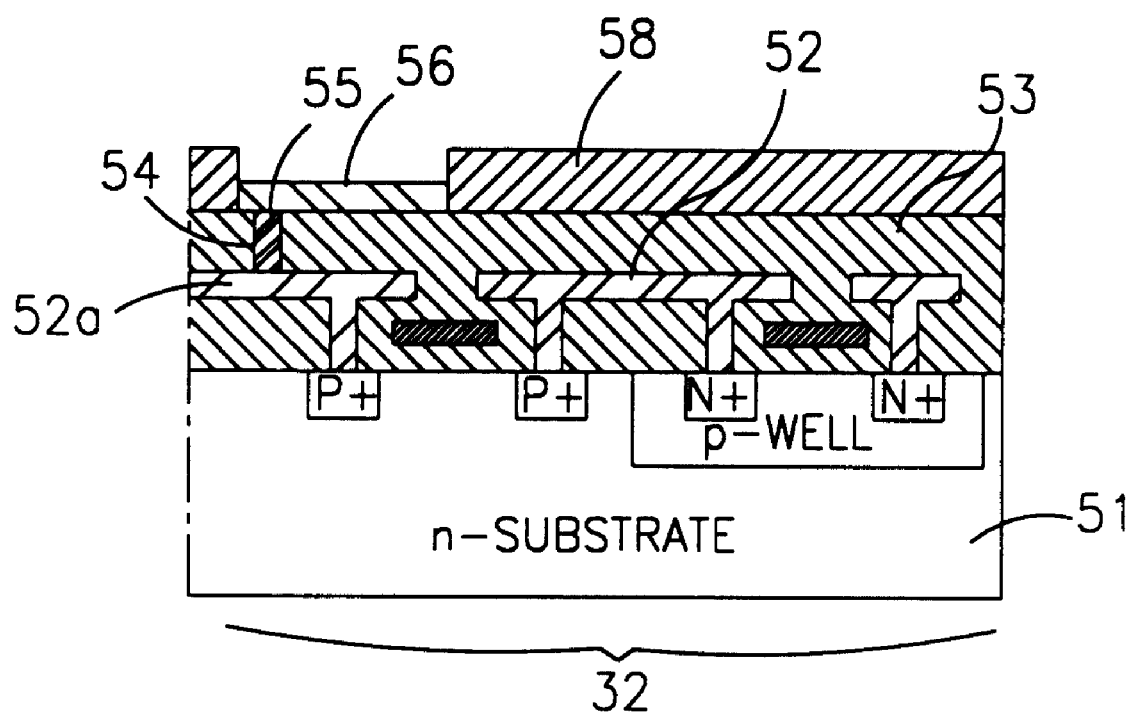
FIG. 9 is a vertical cross-sectional diagram of a semiconductor chip fabricated according to the present invention.

In FIG. 7, the internal circuit 52 of the semiconductor chip 32 is electrically tested by probing a wafer probing tip 60 onto the wafer probing pad 38, which is the extended portion 52b. If the test indicates that the semiconductor chip portion 32 is properly formed, a via hole 54 is formed in the first insulating layer 53 to expose the conductive line 52a of the internal circuit 52, as shown in FIG. 8. A conductive region 55 is formed in the via hole 54. Next, a conductive pattern 56 is formed on the first insulating layer 53. Here, the conductive pattern 56 is electrically connected to the conductive region 55, and is formed only on a portion of the semiconductor chip portion 32 where the internal circuit 52 is provided. A second insulating layer 58 is then formed on the first insulating layer 53 such that an upper surface of the conductive pattern 56 remains exposed. The wafer probing pad 38 and the extended part 52b is covered over, since the wafer probing pad 38 is no longer needed after the wafer probing test is conducted. The conductive pattern 56 which is exposed becomes the chip bonding pad 36, as shown in FIG. 4. Next, the wafer 30 is cut along the chip scribe lanes 34, thus fabricating a plurality of semiconductor chips 32, as shown in FIG. 9.

As described above, according to the present invention the wafer probing pads for testing internal circuits of semiconductor chip portions formed on an uncut wafer are provided on chip scribe lanes, thus freeing more of the available layout area on the semiconductor chip portions for bonding pads. Also, because probing tips contact a portion of a wafer that does not contain a semiconductor chip portion to conduct testing, the internal circuits formed in the semiconductor chip portions are less likely to be damaged by the probing tips.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For instance, although a metal line formed in a semiconductor substrate and a doped semiconductor region formed in a semiconductor substrate may not be structural equivalents in that the metal line uses metal to conduct an electrical signal whereas the doped region uses a doped semiconductor material to conduct an electrical signal, in the environment of conductors, a metal line and a doped semiconductor material may be equivalent structures.

What is claimed is:

1. A method of fabricating a plurality of semiconductor chips, comprising the sequential steps of:

forming a wafer, wherein a plurality of semiconductor chip portions having internal circuits are disposed at regular intervals on the wafer and wherein a plurality of chip scribe lanes are formed between the semiconductor chip portions;

forming a first insulating layer on the wafer;

removing selected portions of the first insulating layer to expose portions of conductive lines in at least one chip scribe lane, wherein the conductive lines extend from at least one internal circuit of a semiconductor chip portion, the exposed portions of the conductive lines forming wafer probing pads;

forming via holes in the first insulating layer to expose a portion of at least one internal circuit of a semiconductor chip portion;

forming conductive regions in the via holes;

forming a conductive layer that is electrically connected to the conductive regions in the via holes such that the conductive layer extends over a portion of a semiconductor chip portion;

forming a second insulating layer on the first insulating layer and on the conductive layer, wherein portions of the conductive layer are exposed to form chip bonding pads; and cutting the wafer along the chip scribe lanes to form a plurality of semiconductor chips.

2. The method of claim 1, wherein the step of forming the second insulating layer comprises forming the second insulating layer such that it covers the wafer probing pads.

3. The method of claim 1, further comprising a step of testing an internal circuit of at least one of the semiconductor chip portions by contacting the wafer probing pads with probe tips, wherein the testing step is conducted before the step of forming via holes is performed.

4. The method of claim 1, wherein the conductive layer and the second insulating layer are formed such that after the cutting step has been performed, the top outer edges of the semiconductor chips are covered by portions of the second insulating layer.

5. A method of fabricating a plurality of semiconductor chips, comprising the steps of:

forming a wafer, wherein a plurality of semiconductor chip portions having internal circuits are disposed at regular intervals on the wafer and wherein a plurality of chip scribe lanes are formed between the semiconductor chip portions;

forming a first insulating layer on the wafer;

removing selected portions of the first insulating layer to expose portions of conductive lines in at least one chip scribe lane, wherein the conductive lines extend from at least one internal circuit of a semiconductor chip portion, the exposed portions of the conductive lines forming wafer probing pads;

forming chip bonding pads on the first insulating layer, the chip bonding pads extending over a portion of a semiconductor chip portion, the chip bonding pads being electrically coupled to at least one internal circuit of the semiconductor chip portion;

forming a second insulating layer over the first insulating layer such that the second insulating layer covers the wafer probing pads, and such that the bonding pads remain exposed; and cutting the wafer along the chip scribe lanes to form a plurality of semiconductor chips.

6. The method of claim 5, further comprising the steps of:

forming via holes in the first insulating layer; and forming conductive regions in the via holes, wherein the chip bonding pads are formed so that they are electrically coupled to corresponding ones of the conductive regions.

7. The method of claim 6, wherein the via holes are formed in the first insulating layer to expose portions of conductive lines that extend from at least one internal circuit of a semiconductor chip portion.

8. The method of claim 6, wherein the via holes are formed in the first insulating layer to expose portions of at least one internal circuit of a semiconductor chip portion.

9. The method of claim 5, wherein the chip bonding pads and the second insulating layer are formed such that after the cutting step has been performed, the top outer edges of the semiconductor chips are covered by portions of the second insulating layer.

10. The method of claim 5, further comprising a step of testing an internal circuit of at least one semiconductor chip portion by contacting the wafer probing pads with probe tips, wherein the testing step is performed before the step of forming a second insulating layer is performed.

* * * * *